United States Patent
Ennaoui et al.

(10) Patent No.: US 7,704,863 B2
(45) Date of Patent: Apr. 27, 2010

(54) METHOD OF THE APPLICATION OF A ZINC SULFIDE BUFFER LAYER ON A SEMICONDUCTOR SUBSTRATE

(75) Inventors: Ahmed Ennaoui, Berlin (DE); Timo Kropp, Berlin (DE); Martha Christina Lux-Steiner, Berlin (DE)

(73) Assignee: Helmholtz-Zentrum Berlin fuer Materialien und Energie GmbH, Berlin (DE)

( * ) Notice: Subject to any disclaimer, the term of this patent is extended or adjusted under 35 U.S.C. 154(b) by 293 days.

(21) Appl. No.: 11/659,920

(22) PCT Filed: Aug. 11, 2005

(86) PCT No.: PCT/DE2005/001431
§ 371 (c)(1),
(2), (4) Date: Feb. 10, 2007

(87) PCT Pub. No.: WO2006/018013
PCT Pub. Date: Feb. 23, 2006

(65) Prior Publication Data
US 2008/0274577 A1    Nov. 6, 2008

(30) Foreign Application Priority Data
Aug. 18, 2004 (DE) .................. 10 2004 040 546

(51) Int. Cl.
*H01L 21/00* (2006.01)
(52) U.S. Cl. ................ 438/497; 257/E27.125
(58) Field of Classification Search ............ 438/492, 438/497, 762, 780, 782
See application file for complete search history.

(56) References Cited

U.S. PATENT DOCUMENTS

2002/0011253 A1*  1/2002  Puri et al. ............... 134/1

(Continued)

FOREIGN PATENT DOCUMENTS

JP          3249342      1/2002

OTHER PUBLICATIONS

T. Nakada and M. Mizutani, "Improved efficiency of Cu(In,Ga)Se2 thin film solar cells with chemically deposited ZnS buffer layers by air-annealing-formation of homojunction by solid phase diffusion", Proceedings of the 28th IEEE Photovoltaic Specialists Conference (Sep. 2000, Anchorage) pp. 529-534.*

(Continued)

*Primary Examiner*—Evan Pert
*Assistant Examiner*—Andres Munoz
(74) *Attorney, Agent, or Firm*—Darby & Darby

(57) ABSTRACT

Chemical bath deposition (CBD) has proved top be the most favorable method for application of a buffer layer to semiconductor substrates, for example, chalcopyrite thin-film solar cells, whereby previously cadmium sulphide (CdS) was deposited and as cadmium is a highly toxic heavy metal, alternatives have been required. According to the invention, the semiconductor substrate is dipped in a solution for approximately 10 minutes, produced by the dissolution of zinc sulphate (0.05-0.5 mol/l) and thiourea (0.2 to 1.5 mol/l) in distilled water at a temperature being held essentially constant throughout said period. For the first time, the ZnS layer permits comparable or higher efficiencies than conventionally only achieved with toxic cadmium compounds. The method is hence much more environmentally-friendly with the same result.

18 Claims, 3 Drawing Sheets

U.S. PATENT DOCUMENTS

2003/0062082 A1* 4/2003 Miteva et al. .............. 136/263

OTHER PUBLICATIONS

A. Ennaoui et al., "Highly efficient Cu(Ga,In)(S,Se)2 thin film solar cells with zinc-compound buffer layers", Thin Solid Films 431-432 (2003) 335-339.*

Jie Cheng et al., Chemical bath deposition of crystalline ZnS thin films Semicond. Sci. Technol. 18 No. 7 (Jul. 2003) 676-679. PII: S0268-1242(03)58148-2.*

Nakada, T. et al.: Polycrystalline Cu(In,Ga)Se2 Thin Film Solar Cells with Chemically Deposited Sulfide (CdS,ZnZ) Buffer Layers; 2nd World Conference and Exhibition on Photovoltaic Solar Energy Conversion, Jul. 6-10, 1998, Vienna, Austria.

Neve, S. et al.: ERDA analysis of ZnSx(OH)y thin films obtained by chemical bath deposition; Mat.Res.Soc.Symp.Proc. vol. 668; 2001 Materials Research Society.

Ennaoui, A. et al.: Highly efficient Cu(Ga,In)(S,Se)2 thin film solar cells with zinc-compound buffer layers; Thin Solid Films 431-432 (2203) 335-339.

Dona, J.M. et al.: Chemical-Bath Deposition of ZnSe Thin Films; J.Electrochem.Soc., vol. 142, No. 3, Mar. 1995.

Lauermann, I, In Situ Analysis of the Zn(S, O) Buffer Layer Preparation for Chalcopyrite Solar Cells by Zn L -edg X-Ray Absorption Spectroscopy, ChemPhys, vol. 10, Published online Jan. 27, 2009, 2009 Wiley-VCH Verlag GmbH & Co. KGaA, Weinheim, Germany, pp. 532-535.

Cheng, J, "Chemical bath deposition of crystalline ZnS thin films", Semiconductor Science and Technology, 2003, vol. 18, published Jun. 11, 2003, IOP Publishing Ltd, pp. 676-679.

C. H. Huanig et al. "A Comparative Study of Chemical-bath-depoisted CdS, (Cd,Zn)S, ZnS, and In(OH)xSy Buffer Layer for CIS-based Solar Cells" In: Conference record of the Twenty-Eigth IEEE Photovoltaic Specialists Conference, ISBN 0-7803-5772-8, 2000, pp. 696-699.

J. M. Dona et al. "Chemical-Bath Deposition of ZnSe Thin Films", In: Journal of Electrochemical Society, vol. 142, No. 3, 1995, pp. 764-770.

D.A. Johnston et al. "Chemical bath deposition of zinc sulfide based buffer layers using low toxicity materials", Preparation and Characterization, Elsevier, Sequoia, NL, vol. 403-404, Feb. 1, 2002, pp. 102-106, XP004430335.

Sang Baosheng et al. "Investigation of chemical-bath-deposited ZnS buffer layers for Cu(InGa)Se2 thin film solar cells", Conference Record of the 29th IEEE Photovoltaic Specialists Conference, vol. Conf. 29, May 19, 2002, pp. 632-635, XP010666379.

J. M. Dona et al. "Process and Film Characterization of Chemical-Bath-Deposited ZnS Thin Films", Journal of the Electrochemical Society, Electrochemical Society, Manchester, New Hampshire, US, vol. 141, No. 1, Jan. 1994, pp. 205-210, XP000445647.

T. Nakada et al. "High-efficiency Cu(In,Ga)Se2 thin-film solar cells with a CBD-ZnS buffer layer", Solar Energy Materials and Solar Cells, Elsevier Science Publishers, Amsterdam, NL, vol. 67, No. 1-4, Mar. 2001, pp. 255-260, XP004224768.

Tokia Nakada et al. "Band offset of high efficiency CBD-ZnS/CIGS thin film solar cells", Preparation and Characterization, Elsevier, Sequoia, NL, vol. 431-432, May 1, 2003, pp. 242-248, XP004428645.

J. Vidal et al. "Influence of magnetic field and type of substrate on the growth of ZnS films by chemical bath", Preparation and Characterization, Elsevier Sequoia, NL, vol. 419, No. 1-2, Nov. 1, 2002, pp. 118-123, XP004391118.

* cited by examiner

METHOD OF THE APPLICATION OF A ZINC SULFIDE BUFFER LAYER ON A SEMICONDUCTOR SUBSTRATE

BACKGROUND OF THE INVENTION

1. Field of the Invention

The invention, in general, relates to a novel method of applying a zinc sulfide buffer layer to a semiconductor substrate by chemical bath deposition, and, more particularly, to the absorber layer of a thin-film solar cell. The method may also be applied, for instance, in the production of II-IV "superstrat" thin-film solar cells and chalcopyrite "superstrat" thin-film solar cells.

2. The Prior Art

Currently, great efforts are being made to develop cost-efficient solar cells. In this respect, chalcopyrite thin-film solar cells represent the latest state of development. In this connection, layers of copper and indium are applied to a substrate. Gallium may be added optionally. The gallium is then reacted with selenium and/or sulfur (CIS, CIGS or CIGSSe, generally CIS solar cells). Among the thin-film technologies, the CIS technology is especially interesting because of its environmental compatibility and because of its low costs.

The solar cells are produced by initially applying, usually in a high vacuum, an electrically conductive layer, usually a sputtered layer of molybdenum, onto float glass or soda lime glass followed by CIS, CIGS or CIGSSe of a thickness of less than 3 μm. As a rule, a buffer layer of cadmium sulfide is applied to this absorber layer. The cover layer then is a transparent and conductive layer, the so-called window layer. For producing modules, the absorber is applied to a structured glass-molybdenum substrate and is also structured following the application of the buffer layer, resulting in an electrical connection. By contacting and framing the entire structure a thin-film solar module results which serves to convert light energy into electrical power.

Because of the disadvantages of glass as a substrate various efforts have also been made to use flexible materials instead of glass. Thus, solar modules are known in which a metallic band is used as the substrate. Plastic foils have also become known for the CIS deposition. An electrolytic application of the CIS layer has also been suggested.

For such thin-film solar cells to operate efficiently, a buffer layer is required between the absorber layer (e.g. $Cu(In_aGa_b)(S_xSe_y)$) and the window layer (i-ZnO/ZnO:Ga). It protects the surface from damage which may result from the application of the window layer. Furthermore, it provides for surface-doping of the absorber layer as well as for passivation of the surface to yield lower surface conditions. The three usual processes, viz. sputtering, vapor deposition or (electro-) chemical deposition are used to apply this very thin buffer layer. Sputtering and vapor deposition both require considerably complex apparatus. Chemical bath deposition (CBD) up to now precipitating cadmium sulfide (CdS) has so far been most desirable. Moreover, below 50 nm, only CBD results in a thin homogenous and uniform cover.

Since cadmium is an extremely toxic heavy metal attempts have been made to find alternatives. Thus, instead of cadmium sulfide, zinc sulfide (ZnS) may be used as well (see, e.g. Nakada et al., Polycrystalline $(Cu(In,Ga)Se_2$ Thin Film Solar Cells with Chemically Deposited Sulfide (CdS, ZnS) Buffer Layers; $2^{nd}$ World Conference and Exhibition on Photovoltaic Solar Energy Conversion, 6-10 Jul. 1998, Vienna.

However, chemical bath deposition processes using zinc sulfide have good deposition rates only when simultaneously using hydrazine. In such a process, zinc sulfide is precipitated from a solution of zinc acetate, thiourea, ammonia and hydrazine, see e.g. Neve et al., ERDA Analysis of $ZnS_x(OH)_y$ Thin Films Obtained by Chemical Bath Deposition, Mat. Res. Symp. Proc. Vol. 668, 2001 Materials Research Society, H5.3.1- H5.3.6 or Ennaoui et al., Highly Efficient Cu(Ga,In)(S,Se)$_2$ Thin Film Solar Cells with Zinc-Compound Buffer Layers, Thin Solid Films 431-432 (2003) pp. 335-339. According to the tests by Neve et al. ammonia may be left out; however, hydrazine is absolutely necessary. Since, however, hydrazine is classified as toxic and carcinogenic, this process offers not much of an ecological advantage. See Herrero et al. Journal of Electrochemical Society, Vol. 142, No. 3, 1995, S. 764-770.

OBJECT OF THE INVENTION

It is, therefore, an object of the present invention to provide a method of applying a zinc sulfide buffer layer on a semiconductor substrate which requires no toxic or environmentally hazardous additives and which offers a comparable or lesser complexity in terms of equipment and time than current cadmium sulfide application methods.

SUMMARY OF THE INVENTION

In accordance with the invention, the object is accomplished by a method of applying a zinc sulfite layer to a semiconductor substrate by a chemical bath deposition comprising the steps of preparing a first solution from water at 70° C. to 90° C. and 0.05 to 0.5 mol/l of zinc sulfate and 0.2 to 1.5 mol/l of thiourea, adding to the first solution ammonia in a quantity of about one-third of the quantity of water to prepare a second solution and dipping the semiconductor substrate into the second solution for about ten minutes after the second solution has become clear—;

Accordingly, following the dissolving of zinc sulfate in distilled water at a temperature of 70° C. to 90° C., thiourea is added. The concentration of zinc sulfate ($C_{ZnSO4}$ should be 0.05-0.5 mil/l, and the concentration of thiourea ($C_{SC(NH2)2}$) should be 0.2-1.5 mol/l. Thereafter, concentrated ammonia (25%) is added (about ⅓ of the quantity of water). A white precipitate is formed which has to be dissolved again by stirring. Before the actual precipitation, the semiconductor substrate was treated with a solution of ammonia and water. Thereafter, it was dipped for about 10 minutes into the chemical bath the temperature of which is maintained constant during this time. During the entire time, the solution is continuously stirred.

It was surprisingly found that simply by another sequence of the reactions between the three participating substances zinc sulfide, thiourea and ammonia and predetermined process conditions the manner of depositing zinc sulfide changed completely, in that by comparison with the method disclosed by Nakada et al. (supra), the zinc ions initially react with the thiourea (they are complexed) and ammonia is only added thereafter which then also reacts (complexes) with the remaining zinc ions. In this reaction thiourea acts as a complexing agent and as a source of sulfide ions.

A uniformly thick layer of zinc sulfide is formed. To obtain greater layer thickness, the process may be repeated several times.

Advantageously, the substrates are thereafter rinsed in a solution of ammonia and water and dried in a stream of nitrogen gas.

Finally, tempering takes place in air at between 100° C. and 180° C.

A complete cell is obtained after application of the window layer.

In respect of CuInS$_2$ solar cells, an efficiency of more than 10% (active range) can be reached.

In connection with CuInS$_2$ solar cells, the following advantages are offered:

With the ZnS layer it has become possible for the first time to obtained comparable or higher efficiencies than is currently possible with toxic cadmium compounds. At the same yield, the process is significantly more environmentally friendly.

The deposition takes place in one operational step (only a single cycle of ten minutes' duration) so that the process may be automated in a simple manner.

The deposition takes no more time than does the conventional method. Rates of deposition of 1-2 nm/min are achieved. Thick layers in particular are very homogenous and compact. Thus, cell have become possible without the superimposed i-ZnO layer.

The same equipment as heretofore can be used without requiring significant restructuring. "Upscaling" is possible in a simple manner.

Compared to a cadmium sulfide layer, the zinc sulfide layer offers the advantage of a greater band gap so that it is effective in a wider spectral range and delivers a higher current yield.

As a by-product, the method yields high-value ZnS/ZnO powder which may used for other purposes.

DESCRIPTION OF THE SEVERAL DRAWINGS

The novel features which are considered to be characteristic of the invention are set forth with particularity in the appended claims. The invention itself, however, in respect of its structure, construction and lay-out, as well as manufacturing techniques, together with other objects and advantages thereof, will be best understood from the following description when read with reference to the drawings, in which:—

DETAILED DESCRIPTION OF THE PREFERRED EMBODIMENT

The following layer structure was exemplarily chosen for a chalcopyrite thin-film solar cell (no module).

| | |
|---|---|
| Substrate: | Glass |
| Rear Contact Layer: | Molybdenum |
| Absorber: | CuInS$_2$ |
| Buffer Layer: | ZnS |
| Window Layer: | i-ZnO/ZnO:Ga |
| Light-side Contact: | NiAl |

For applying ZnS to chalcopyrite absorbers the samples 1 are stored in a solution of ammonia and water prior to the chemical bath deposition.

Figure 1:
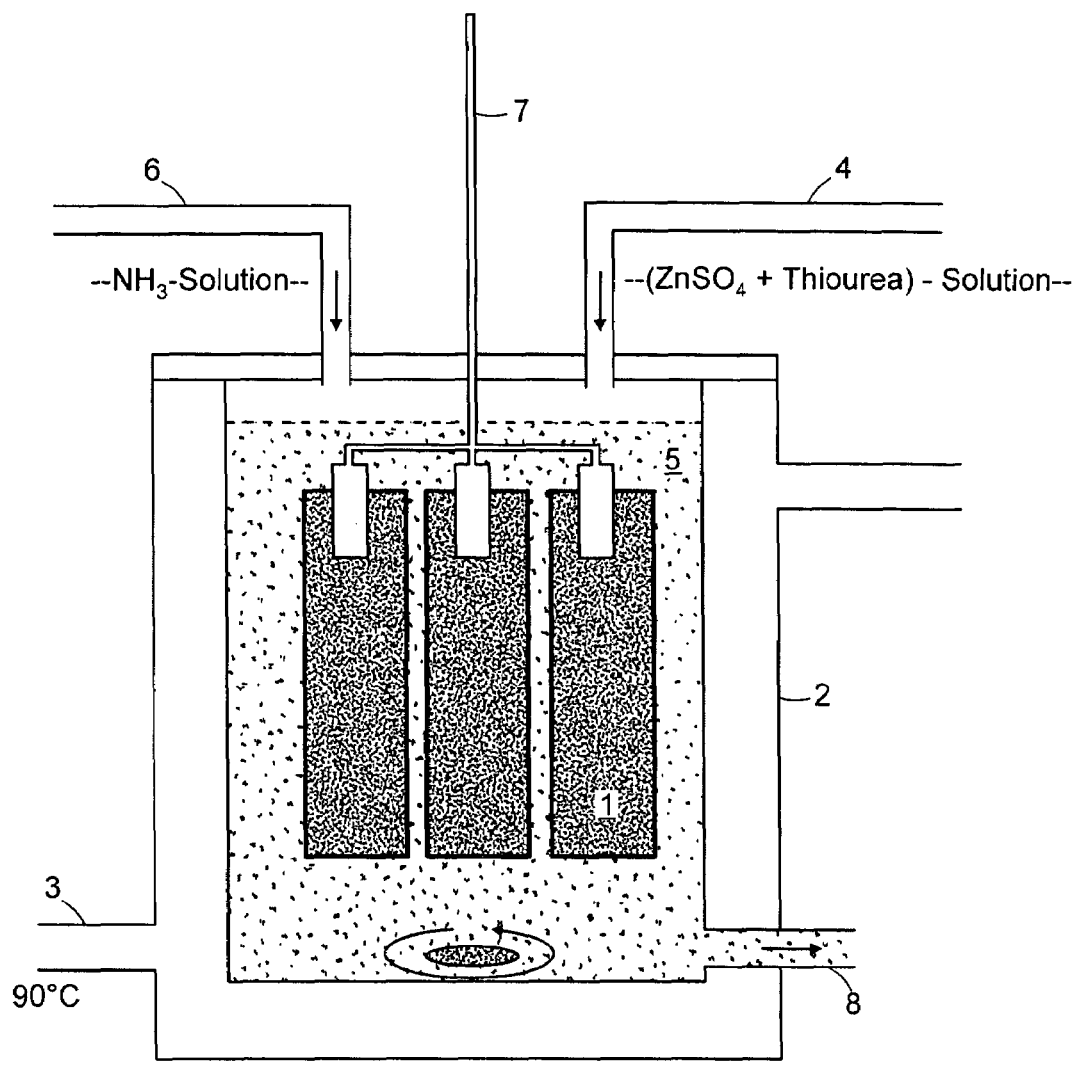
FIG. 1 depicts a first test arrangement for coating a sample.

FIG. 1 depicts the structure of the test. A sample vessel 2 provided with a heater 3 is used.

The chemical bath depicted in FIG. 1 is prepared as follows:

1) A hot solution (70-m90° C.) with 0.05 to 0.5 mol/l zinc sulfate and 0.2 to 1.5 mol/l thiourea is prepared with twice-distilled water (indicated by feed line 4).

2) This solution is stirred for some time.

3) NH$_3$ solution (25%) is then added (indicated by feed line 6). A white precipitate can be observed at once; it is dissolved again by continuous stirring. A complete clear solution with a pH value of 10 to 11 results.

4) The samples 1 are fixed in a sample holder and dipped. Stirring of the solution is continued during the deposition and the temperature is maintained.

5) After abut 10 minutes the samples 1 are removed; the initially clear solution begins to turn opaque.

6) The samples 1 are washed in a water/ammonia solution and dried in a stream of nitrogen gas.

7) The resulting layer thickness of the samples 1 on the absorber is about 10-15 nm.

8) The process may be repeated to provide thicker film layers. Three cycles yield a layer thickness of 60 nm. There is no need for rinsing and drying between the cycles.

9) The coated samples 1 are then tempered in air on a heating plate at 100-180° C. for a predetermined time.

The reaction is presumed to proceed as follows:

$$Zn^{2+} + nTU = [Zn(TU)_n]^{2+} \tag{1}$$

When adding NH$_3$ a second complex results from excess Zn$^{2+}$:

$$Zn^{2+} + 4NH_3 = [Zn(NH_3)_4]^{2+} \tag{2}$$

The dissociation of the Zn complexes from reaction (1) and (2) yields free Zn cations. Thiourea acts as a complexing agent as well as a source of sulfide ions.

Figure 2:
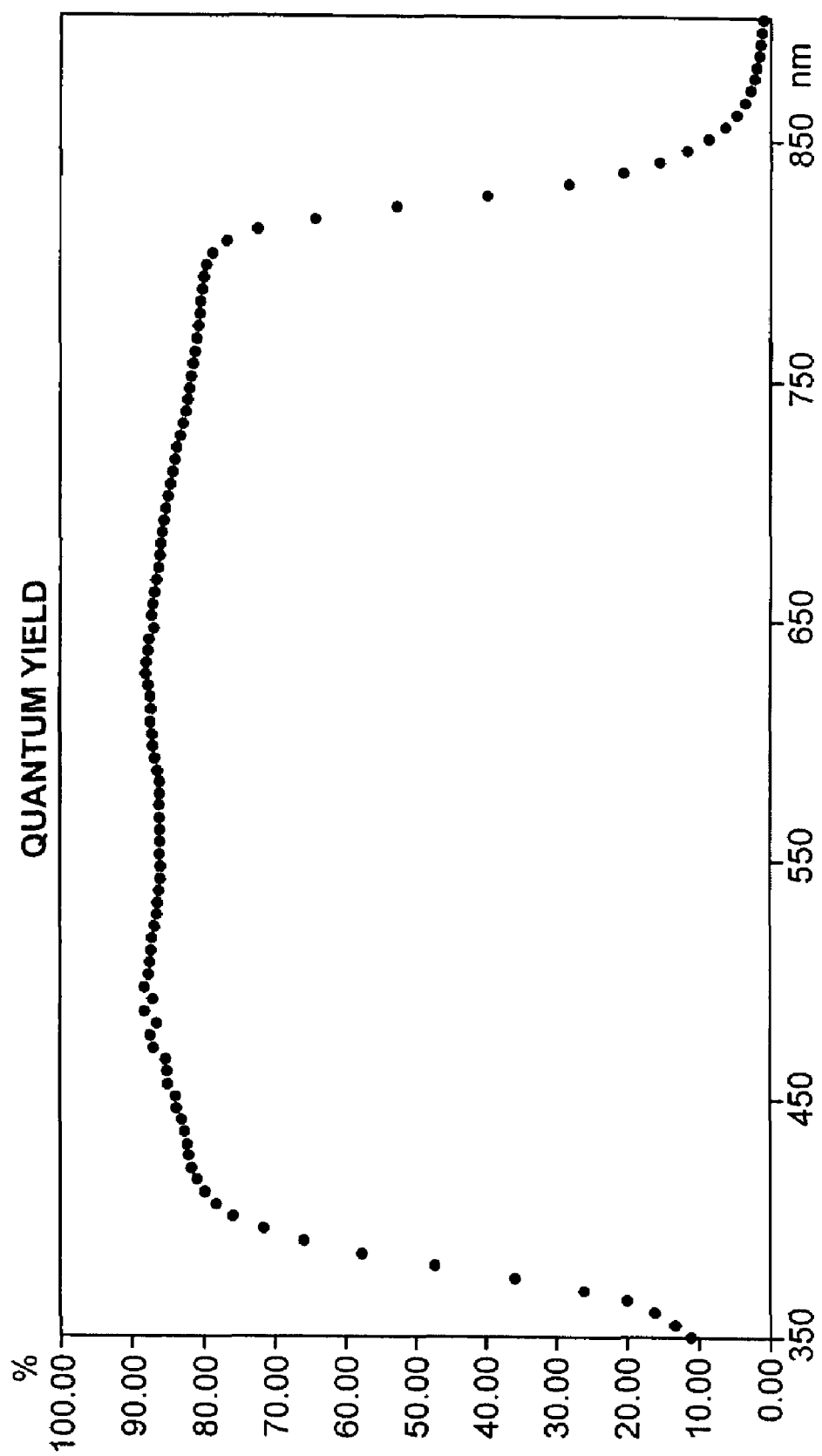
FIG. 2 shows the quantum yield of a sample.

FIG. 2 depicts the quantum yield attained with the sample (ratio of charges generated relative to the applied light energy.

Figure 3:
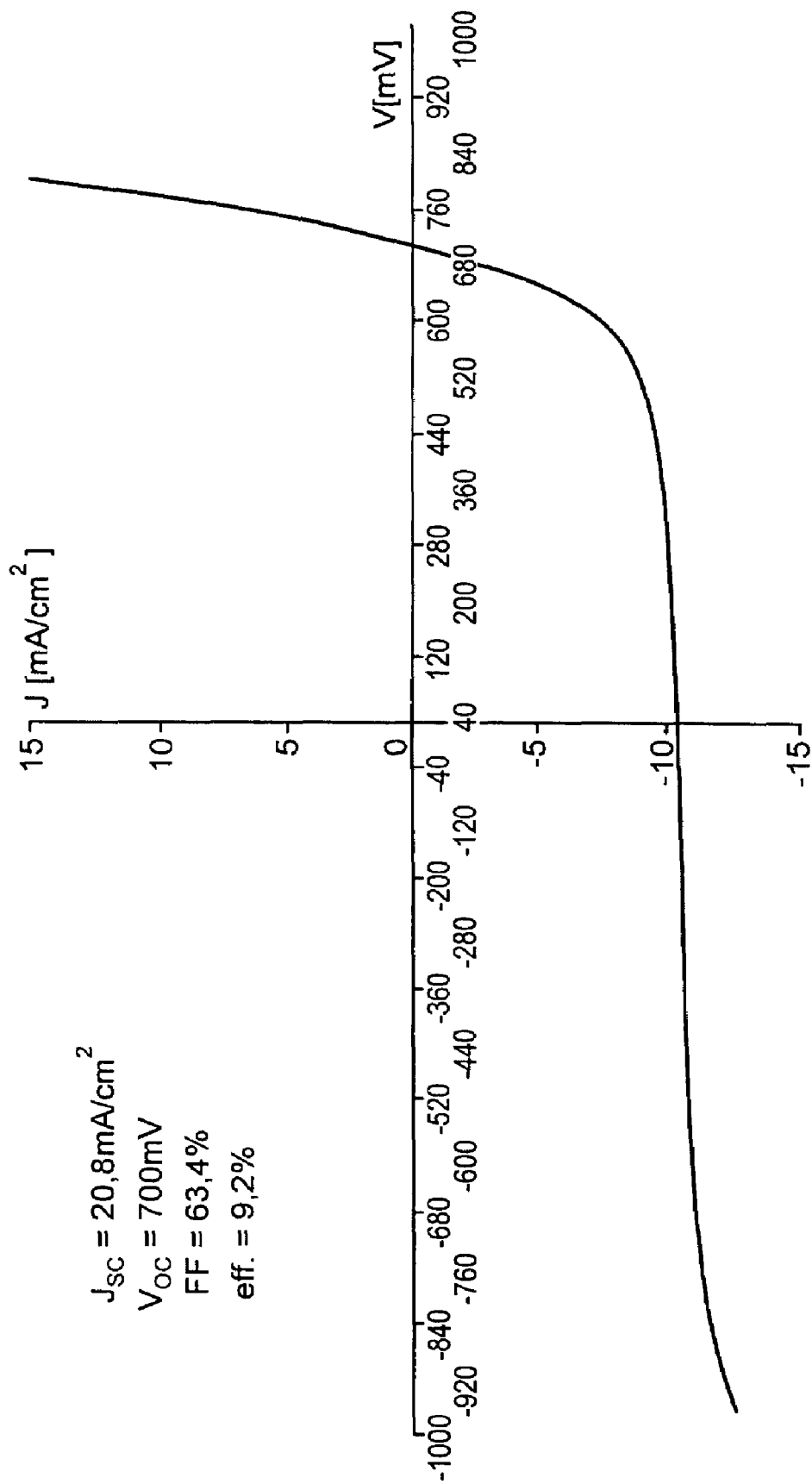
FIG. 3 shows the current-voltage-curve of a sample.

The efficiencies reached were at about 10.5% (in the photovoltaic active range). FIG. 3 depicts the current-voltage-curve of a solar cell measured in a solar simulator (AM 1.5/100 mW/cm$^2$). The short-circuit current density was at about 22.7 mA/cm$^2$ (relative to the active range) and the open-circuit voltage V$_{oc}$ at about 700 mV. The filling factor (ratio of the product of current and voltage at an operating point relative to the product of short-circuit current I$_{sc}$ and open-circuit voltage V$_{oc}$) is very high at 65%.

What is claimed is:

1. A chemical bath deposition method of depositing on a semiconductor substrate a layer of zinc sulfide, comprising the steps of:

preparing a first solution by adding to water at from 70° C. to 90° C. from 0.05 to 0.5 mol/l zinc sulphate and 0.2 to 1.5 mol/l thiourea;

preparing a second solution by adding to the first solution ammonia at a quantity of about one-third the quantity of the water; and dipping the semiconductor substrate into the second solution for about 10 minutes.

2. The method of claim 1, wherein the water is double-distilled water.

3. The method of claim 1, wherein the ammonia is of a concentration of about 25%.

4. The method of claim 1, wherein the semiconductor substrate comprises glass.

5. The method of claim 4, wherein the glass comprises one of float glass and soda lime glass.

6. The method of claim 5, further including the step of stirring the second solution to render it clear.

7. The method of claim 1, wherein the semiconductor substrate comprises a thin-film solar cell comprising an absorber layer.

8. The method of claim 7, wherein the thin-film solar cell comprises a chalcopyrite thin-layer solar cell.

9. The method of claim 7, further comprising stirring while the semiconductor is in the second solution.

10. The method of claim 1, wherein the step of dipping is repeated at least once to increase the thickness of the layer.

11. The method of claim 1, wherein the second solution initially becomes opaque and wherein the semiconductor substrate is dipped into the second solution after it has become clear.

12. The method of claim 1, further comprising the step of maintaining the temperature of the second solution substantially constant while the semiconductor is in the second solution.

13. The method of claim 1, further comprising the step of treating the semiconductor in a third solution of water and ammonia prior to dipping it into the second solution.

14. The method of claim 1, further comprising the step of rinsing the semiconductor in a third solution after the dipping.

15. The method of claim 1, further including the step of drying the semiconductor substrate in a stream of inert gas.

16. The method of claim 15, wherein the inert gas is nitrogen.

17. The method of claim 1, further including the step of tempering the semiconductor substrate.

18. The method of claim 17, wherein the tempering is carried out in air at a temperature of from about 100° C. to about 180° C.

* * * * *